(12) United States Patent
Guettaf

(10) Patent No.: US 7,581,150 B2
(45) Date of Patent: Aug. 25, 2009

(54) METHODS AND COMPUTER PROGRAM PRODUCTS FOR DEBUGGING CLOCK-RELATED SCAN TESTING FAILURES OF INTEGRATED CIRCUITS

(75) Inventor: Amar Guettaf, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 118 days.

(21) Appl. No.: 10/950,637

(22) Filed: Sep. 28, 2004

(65) Prior Publication Data

US 2006/0069972 A1 Mar. 30, 2006

(51) Int. Cl.
*G01R 31/28* (2006.01)
(52) U.S. Cl. .................. 714/729; 714/726; 702/185
(58) Field of Classification Search .................. 714/25, 714/703–746
See application file for complete search history.

(56) References Cited

U.S. PATENT DOCUMENTS

| | | | |
|---|---|---|---|
| 4,493,077 A | | 1/1985 | Agrawal et al. |
| 4,727,545 A | * | 2/1988 | Glackemeyer et al. ........ 714/33 |
| 5,210,486 A | | 5/1993 | Wilson et al. |
| 5,235,600 A | | 8/1993 | Edwards |
| 5,278,842 A | * | 1/1994 | Berry et al. .................. 714/726 |
| 5,386,423 A | | 1/1995 | Koo et al. |
| 5,491,700 A | | 2/1996 | Wright et al. |
| 5,515,384 A | * | 5/1996 | Horton, III .................. 714/732 |
| 5,541,940 A | | 7/1996 | Akita |
| 5,621,651 A | | 4/1997 | Swoboda |
| 5,663,967 A | * | 9/1997 | Lindberg et al. ............ 714/737 |
| 5,812,562 A | | 9/1998 | Baeg |
| 5,859,442 A | | 1/1999 | Manning |
| 5,905,855 A | | 5/1999 | Klaiber et al. |
| 5,909,451 A | * | 6/1999 | Lach et al. .................. 714/726 |
| 6,199,182 B1 | | 3/2001 | Whetsel |

(Continued)

OTHER PUBLICATIONS

U.S. Appl. No. 10/806,093, entitled "Methods for Debugging Scan Testing Failures of Integrated Circuits," filed Mar. 23, 2004.

(Continued)

*Primary Examiner*—Cynthia Britt
*Assistant Examiner*—Steve Nguyen
(74) *Attorney, Agent, or Firm*—Sterne, Kessler, Goldstein & Fox, P.L.L.C.

(57) ABSTRACT

The present invention is directed to a method for debugging scan testing failures of integrated circuits. The method includes identifying good and bad scan paths among a set of scan paths. A scan path is bad if it is not producing any output. A scan path is good if it is producing a correct output. A clock set is generated for each scan path. The clock set includes all clock elements whose outputs impact the scan path. A union of the scan path clock sets for the bad scan paths is created. Good clock elements are removed from the union. A clock element is presumed to be good if it is associated with a good scan path. Clock elements remaining within the union of clock sets for the bad scan paths are analyzed to determine the source of errors. In one embodiment, multiple input clock elements in all bad scan paths are analyzed first, followed by analysis of single input clock elements in all bad scan paths and followed by analysis of any other clock elements in any of the bad scan paths. In an alternative embodiment, failure probabilities are associated with clock elements to prioritize analysis and debugging.

12 Claims, 4 Drawing Sheets

U.S. PATENT DOCUMENTS

| | | |
|---|---|---|
| 6,260,166 B1 * | 7/2001 | Bhavsar et al. ............... 714/727 |
| 6,378,093 B1 | 4/2002 | Whetsel |
| 6,452,435 B1 | 9/2002 | Skergan et al. |
| 6,539,497 B2 | 3/2003 | Swoboda et al. |
| 6,646,460 B2 | 11/2003 | Whetsel |
| 6,760,866 B2 | 7/2004 | Swoboda et al. |
| 6,763,485 B2 | 7/2004 | Whetsel |
| 6,861,867 B2 | 3/2005 | West et al. |
| 6,915,494 B2 * | 7/2005 | Shigeta ........................ 716/4 |
| 6,978,416 B2 | 12/2005 | Widmer |
| 6,999,386 B2 | 2/2006 | Sugimoto et al. |
| 7,055,172 B2 * | 5/2006 | Griswold ...................... 726/3 |
| 7,239,978 B2 * | 7/2007 | Cheng et al. ................. 702/185 |
| 2003/0208710 A1 | 11/2003 | Martin-de-Nicolas et al. |
| 2004/0123222 A1 | 6/2004 | Widmer |

OTHER PUBLICATIONS

Office Action for U.S. Appl. No. 10/806,093, dated Apr. 18, 2006 17 pages.

Office Action for U.S. Appl. No. 10/806,093, dated Oct. 19, 2006, 18 pages.

Office Action for U.S. Appl. No. 10/806,093, May 16, 2007, 14 pages.

* cited by examiner

METHODS AND COMPUTER PROGRAM PRODUCTS FOR DEBUGGING CLOCK-RELATED SCAN TESTING FAILURES OF INTEGRATED CIRCUITS

BACKGROUND OF THE INVENTION

1. Field of the Invention

The present invention relates to integrated circuits, and more particularly, to scan testing of integrated circuits.

2. Background of Invention

Effective testing of integrated circuits significantly enhances the ability of integrated circuit developers and manufacturers to provide reliable devices. Various techniques have been employed to test integrated circuits during the manufacturing process. One such technique that is commonly known, and has been used within the industry for over twenty years is scan testing.

Scan testing provides an efficient approach to testing the structural integrity of devices, such as flip-flops, within a complex integrated circuit. Scan testing does not test integrated circuit-level functionality. Rather, test personnel use scan testing to confirm that individual flip-flops within an integrated circuit function properly. The sheer number of flip-flops within an integrated circuit, which is often greater than a million, presents a daunting challenge for testing. Scan testing addresses this challenge through the use of automated test units that provide test vectors to scan paths including thousands of flip-flops within integrated circuits that have been designed to support scan testing.

Typically, complex integrated circuits are designed and implemented as a series of interconnected functional blocks, each of which can be tested independently. Devices, such as flip-flops, within these functional blocks can be designed, such that they can be connected together in a scan path to support scan testing. Flip-flops and other elements within a scan path include, in addition to inputs and outputs used for normal operation, two inputs associated with the scan testing capability. These include a scan input (SI) and a scan enable (SE) input. Flip-flops within a scan path have their output connected to the SI input of a subsequent flip-flop. The first flip-flop within a scan path receives its input from an automated test unit through a test access port on the chip. The last flip-flop within a scan path provides its output to the automated test unit through a test access port. Many scan paths can exist within a single integrated circuit.

While scan testing provides significant benefits, a shortcoming exists related to how to efficiently debug a scan testing failure to identify the source or sources of the failure. Identifying the source of a scan path failure can be quite difficult. A typical integrated circuit can include many scan paths with each scan path including as many as 10,000 flip-flops. Additionally, when doing scan testing tens of external clock sources can exist. These external clock sources are in turn coupled through multiplexers, logic gates and buffers to form complicated clock trees, such that a single scan path can be effected by multiple clock sources with thousands of clock tree elements.

A wide variety of sources for errors can exist. For example, errors can be caused by process, voltage, and/or temperature variations in which the circuit can function normally at a particularly frequency, temperature or voltage, but when these factors are changed errors can occur. In another example, an incorrect or faulty design, such as using a latch instead of a flip-flop, can cause errors. Yet another example, could be that the mask used to fabricate the integrated circuit was bad leading to broken connections between flip-flops or poorly performing flip-flops. In another case, a wrong wiring diagram can be used by the tester. In this case, a tester might perceive errors, which are not actually errors. Often times the errors are the result of failures in clock trees in which a clock signal is not properly propagated as a result of bad multiplexer or buffer. Given the large number of scan paths, the large number of flip-flops in a scan path, the interrelationship between scan paths and the many possible sources of errors, debugging scan test failures can take days or even months.

When conducting scan testing two types of general error results can occur. In the first case, the scan paths under test generate output signals, but the output does not match the expected results. For example, a scan path output may be expected to be 1 0 1 0 1 1 0 1 1 0, but the actual output is 0 0 0 1 1 1 0 1 1 0 1. These are abbreviated scan path outputs for ease of illustration. Actual outputs will consist of thousands of data points.

In the second type of general error, a scan path under test generates no output signal. In this case, there are often multiple scan paths that have failed. This type of failure scenario is often the result of clock or clock tree problems.

Commonly owned, co-pending U.S. patent application Ser. No. 10/806,093, entitled "Methods for Debugging Scan Testing Failures of Integrated Circuits," filed Mar. 23, 2004, provides methods for debugging scan testing failures of integrated circuits. U.S. patent application Ser. No. 10/806,093 ('093 application") is incorporated herein by reference in its entirety. The '093 application discloses a method that identifies the source of errors when scan paths are producing outputs that are incorrect. The methods dramatically reduce the time needed to debug circuit errors, thereby reducing integrated chip production costs and streamlining integrated circuit manufacturing. The method works well with the first type of errors discussed above. While the method can be used to debug errors in the second case, because the second case usually involves many failed scan paths, the method is not as effective and more efficient approaches are needed.

What is needed is a method for efficiently debugging scan testing failures to identify the source of the failure when scan paths do not produce any output during testing.

SUMMARY OF THE INVENTION

The present invention is directed to methods for debugging scan testing failures of integrated circuits. The method includes identifying good and bad scan paths among a set of scan paths. A scan path is bad if it is not producing any output. This scan path may be referred to as a bad scan path or a failed scan path. A scan path is good if it is producing a correct output.

In accordance with an aspect of the invention, a clock set is generated for each scan path. The clock set for a scan path includes all clock elements whose outputs impact the scan path. A union of the scan path clock sets for the bad scan paths is created. Good clock elements are removed from the union. A clock element is presumed to be good if it is associated with a good scan path. Clock elements remaining within the union of clock sets for the bad scan paths are analyzed to determine the source of errors. Clock elements can include multiple input clock elements and single input clock elements.

In one embodiment, multiple input clock elements that exist within all bad scan paths are analyzed first. Single input clock elements that exist within all bad scan paths analyzed next. If the source of error is not yet determined, then any other clock elements existing in any of the bad scan paths are analyzed. In an alternative embodiment, failure probabilities are associated with clock elements to prioritize analysis and debugging.

The invention reduces the time to debug scan test failures, which reduces integrated chip production costs and streamlines integrated circuit manufacturing.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of utility.

Figure 1:
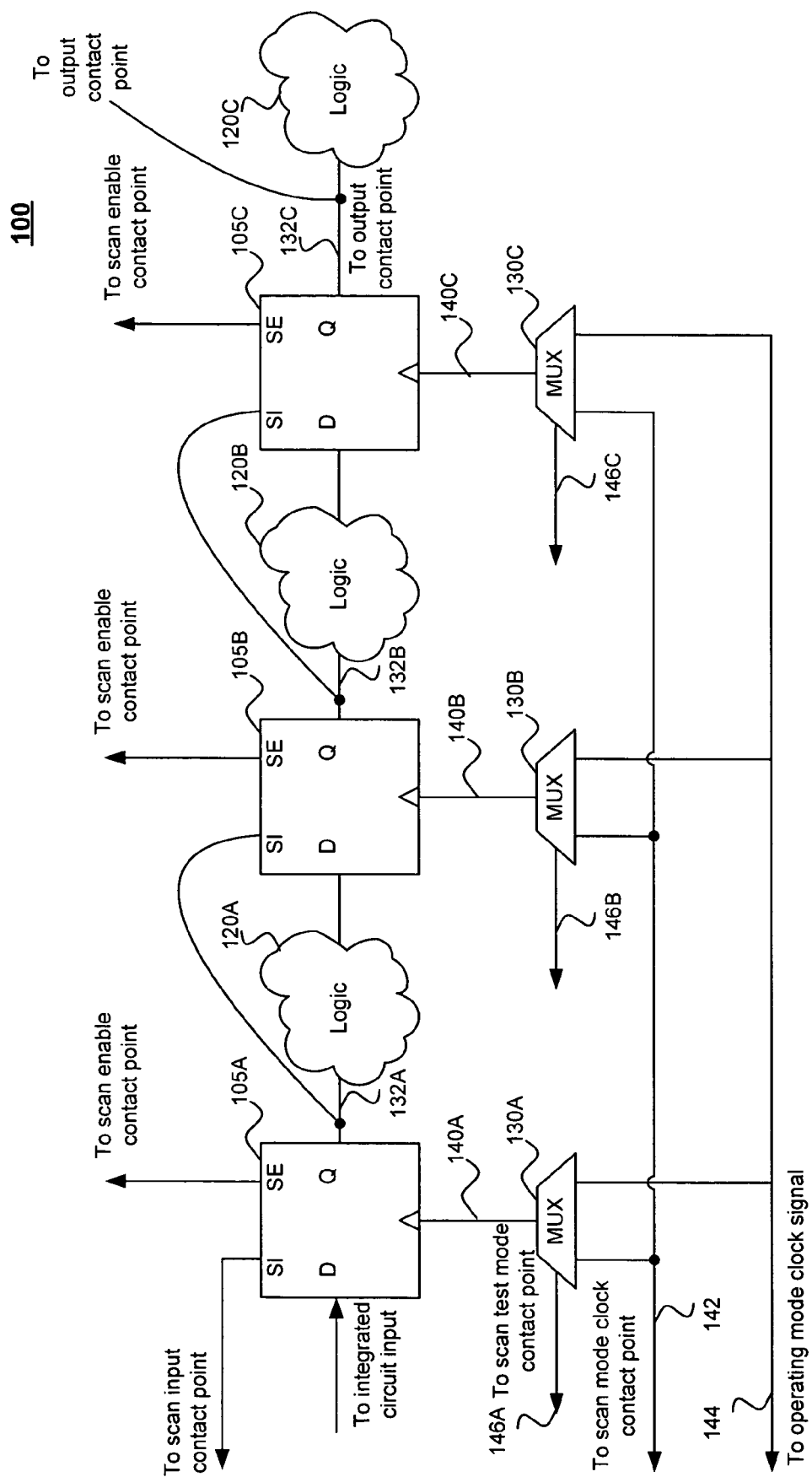
FIG. 1 is a diagram of a truncated scan path.

FIG. 1 illustrates an example of a truncated scan path within an integrated circuit. The scan path includes flip-flop 105A, flip-flop 105B, and flip-flop 105C. Flip-flop 105A represents the first flip-flop in the scan path. An SI input on flip-flop 105A is coupled to a scan input contact point. The scan input contact point provides an interface to an automated testing unit that allows test patterns to be inputted. An SE input on flip-flop 105A is coupled to a scan enable contact point.

Two modes exist within scan testing: shift mode and capture mode. In shift mode, a flip-flop will process inputs received on the SI input. The scan enable contact point provides an interface to an automated testing unit that allows the test unit to provide a signal that places a flip-flop into shift mode. In capture mode, a flip-flop will process inputs received on the D input, as would be the case in normal operating mode. In this case, a low signal is typically applied to the SE input to enter capture mode.

Output 132 of each flip-flop in a scan path is coupled to an SI input of the subsequent flip-flop in a scan path. For example, output 132A of flip-flop 105A is coupled to the SI input of flip-flop 105B. The output 132B of flip-flop 105B is coupled to the SI input of flip-flop 105C. As flip-flop 105C represents the last flip-flop in the scan path, its output 132C is coupled to an output contact point that can be coupled to the automated test unit to enable the test unit to monitor the output patterns during testing. Additionally, outputs 132 from flip-flops 105 are connected to other devices (e.g., logic 120) for normal operation—non-scan test mode—supporting integrated circuit logic and operations.

Clock inputs 140 for each of flip-flops 105 are received from a multiplexer, such as multiplexers 130A, 130B, and 130C. Multiplexers 130 receive and select between clock signal inputs 142 and 144. Clock signal 144 is used for normal operation. Clock signal 142 is used in scan testing mode. In addition, as discussed further below, memory and other functional components contained within logic 120 will receive one or more clock signals. Each of multiplexers 130A, 130B, and 130C have a control input 146 connected to a scan test mode clock contact point. When scan testing is to take place, an automated test unit controls multiplexers 130A, 130B, and 130C via control inputs 146 to connect the scan testing mode clock signal 142 to the flip-flop clock inputs 140.

FIG. 1 shows the output of each of the multiplexers 130A, 130B, and 130 going to a single flip-flop.

Once the flip-flop, such as flip-flops 105, is in scan test shift mode, a test input signal will be inputted from a test vector to the SI input. One or more scan test clock.

Figure 2:
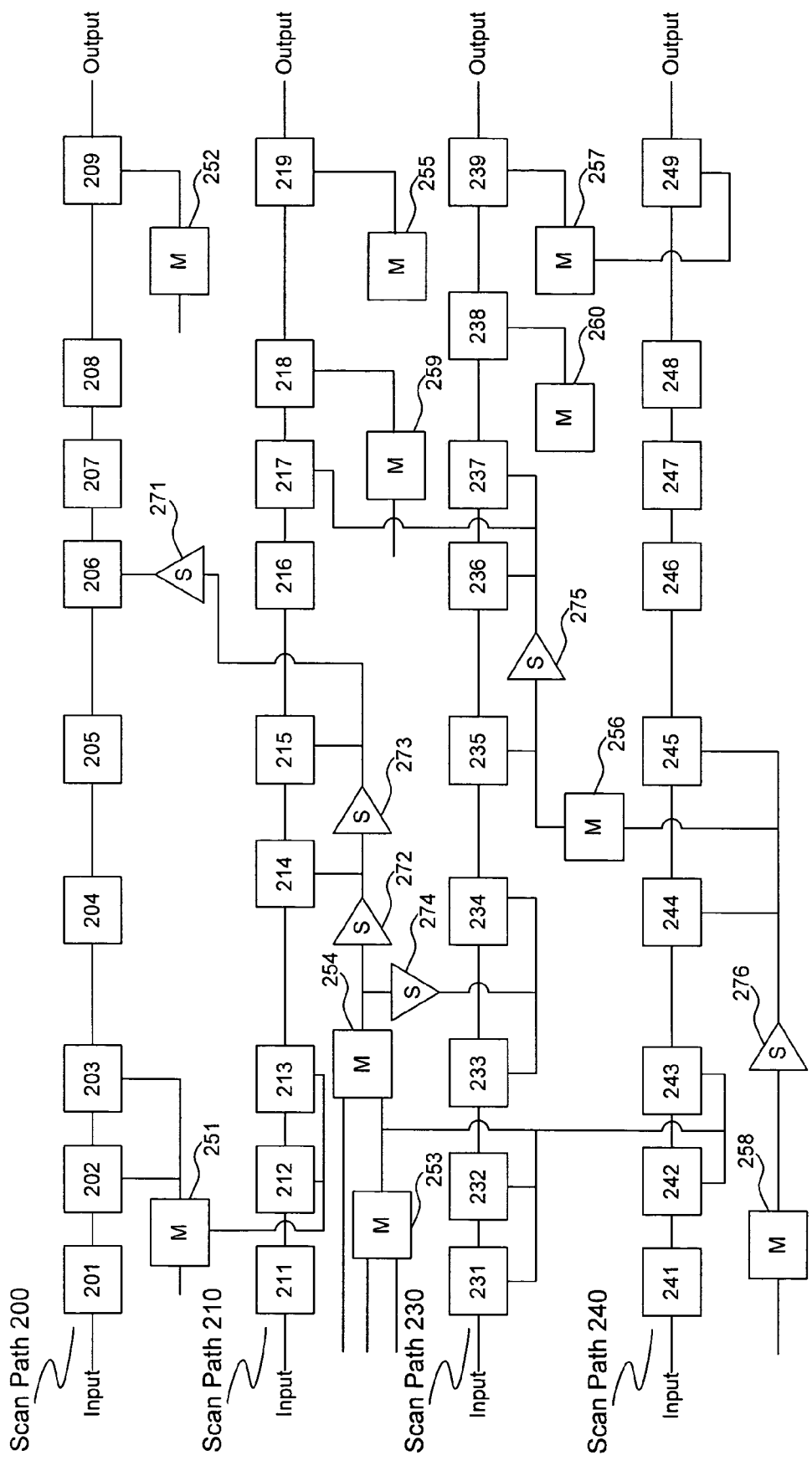
FIG. 2 is a diagram of four scan paths.

FIG. 2 provides a diagram of four example scan paths that represent a relatively small portion of scan paths that might exist in an actual integrated circuit. These scan paths shall be referred to with reference to the debugging method illustrated in FIG. 3, which is described below. The four scan paths are scan path 200, scan path 210, scan path 230 and scan path 240. As discussed above each scan path can include as many as 10,000 flip-flops. For ease of illustration, scan paths 200, 210, 230, and 240 represent only a small number of scan paths that can be included in an integrated circuit and each contain only nine flip-flops.

Scan path 200 includes flip-flops 201 through 209. Scan path 210 includes flip-flops 211 through 219. Scan path 230 includes flip-flops 231 through 239. Scan path 240 includes flip-flops 241 through 249. Within each scan path, the flip-flops are coupled to each other in sequential order.

FIG. 2 also shows portions of clock trees. For ease of illustration and explanation, FIG. 2 does not show all of the clock inputs, trees and elements that would normally be present. For example, many flip-flops, such as flip-flops 204 and 205 do not show a clock input. In an actual circuit all flip-flops will have a clock input.

FIG. 2 shows two types of elements in the portion of the clock trees shown. These are elements that have multiple inputs, for example, multiplexers and logic gates. These are shown in the figure by boxes labeled with an M. For ease of illustration not all inputs are shown for multiple input elements. The other type of element is an element that has a single input, for example, a buffer. These are shown in the figure by triangles labeled with an S.

Multiple input clock element 251 produces an output that is fed into flip-flops 202, 203, 212 and 213. Multiple input clock element 252 produces a clock output that is provided to flip-flop 252. Multiple input clock element 253 produces a clock output that is provided to flip-flops 231, 232, 242, and 243, and multiple input clock element 254. Multiple input clock element 254 produces a clock output that is provided to single clock elements 272 and 274. Multiple input clock element 255 produces a clock output that is provided to flip-flop 219. Multiple input clock element 256 produces a clock output that is provided to flip-flop 235 and single input element 275. Multiple input clock element 257 produces a clock output that is provided to flip-flops 239 and 249. Multiple input clock element 258 produces a clock output that is provided to single input clock element 276. Multiple input clock element 259 produces a clock output that is provided to flip-flop 218. Multiple input clock element 260 produces a clock output that is provided to flip-flop 238

Single clock input element 271 produces a clock output that is provided to flip-flop 206. Single clock input element 272 produces a clock output that is provided to flip-flop 214 and single clock input element 273. Single clock input element 273 produces a clock output that is provided to flip-flop 215 and single input element 271. Single clock input element 274 produces a clock output that is provided to flip-flops 233 and 234. Single clock input element 275 produces a clock output that is provided to flip-flops 217, 236 and 237. Single clock input element 276 produces a clock output that is provided to flip-flops 244 and 245, and to multiple clock input element 256.

Another way of explaining the relationship between the flip-flops and the clock elements is to provide the clock element tree associated with each of the flip-flops. Such associations are commonly found in testing software, such as Synopsis' PRIMETIME test software.

The table below provides the clock trees associated with each flip-flop. Note that a short hand notation is used for the clock elements. Multiple input clock elements are referred to as M followed by their label number. For example, multiple input clock element 251 is referred to as M251. Single input clock elements are referred to as S followed by their label number. For example, single input clock element 272 is referred to as S272.

| Flip-Flop | Scan Path | Clock Tree |
|---|---|---|
| 202 | 200 | M251 |
| 203 | 200 | M251 |
| 206 | 200 | M253, M254, S272, S273, S271 |
| 209 | 200 | M252 |
| 212 | 210 | M251 |
| 213 | 210 | M251 |
| 214 | 210 | M253, M254, S272 |
| 215 | 210 | M253, M254, S272, S273 |
| 217 | 210 | M258, S276, M256, S275 |
| 218 | 210 | M259 |
| 219 | 210 | M255 |
| 231 | 230 | M253 |
| 232 | 230 | M253 |
| 233 | 230 | M253, M254, S274 |
| 234 | 230 | M253, M254, S274 |
| 235 | 230 | M258, S276, M256 |
| 236 | 230 | M258, S276, M256, S275 |
| 237 | 230 | M258, S276, M256, S275 |
| 238 | 230 | M260 |
| 239 | 230 | M257 |
| 242 | 240 | M253 |
| 243 | 240 | M253 |
| 244 | 240 | M258, S276 |
| 245 | 240 | M258, S276 |
| 249 | 240 | M257 |

As can be seen from FIG. 2 and the above table, even within a relatively simple example determining the relationship between clock elements and flip-flops can quickly become complex and cumbersome. The relationship between which clock elements impact multiple scan paths becomes even more complex. As a result, historically, when scan testing failures occurred where no output was generated and numerous scan paths were failing, debugging to find the source of the errors often took weeks or even months. This debugging typically was done manually. For example, testers often need to decap a chip (i.e., remove the cap on an integrated circuit to expose internal electrical leads), multiple times to isolate different segments of the scan paths tested in an attempt to locate the error source. Such a process was tedious and time consuming, and often ineffective.

Figure 3:
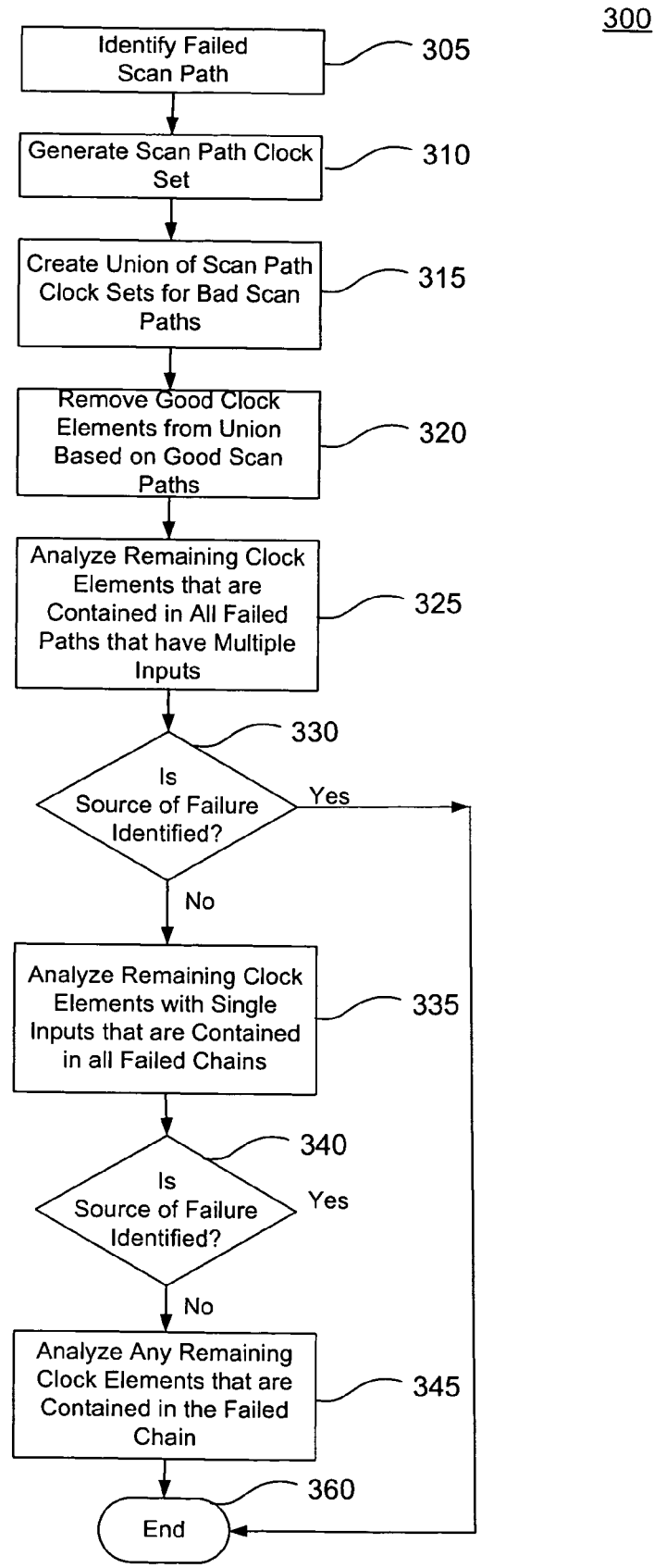
FIG. 3 is a flow chart of a method for debugging scan testing failures of an integrated circuit, according to an embodiment of the invention.

FIG. 3 provides a flowchart of method 300 to debug clock-related scan testing failures of integrated circuits, according to an embodiment of the invention. To assist in the explanation of method 300, reference will be made to the scan paths in FIG. 2. The invention is not, however, limited to the example of FIG. 2. Method 300 begins in step 305. In step 305 the failed scan paths are identified. Scan paths can fail by either not outputting any results or by outputting results that differ from the expected results. In method 300 failed scan paths refer to scan paths in which no output is being generated. Alternatively, failed scan paths are referred to as bad scan paths. As was discussed above, copending, commonly owned, U.S. patent application Ser. No. 10/806,093 provides methods for debugging failed scan paths when incorrect results are being outputted.

For the purpose of illustration, assume that in FIG. 2, scan paths 210 and 230 are determined to have failed, while scan paths 200 and 240 are determined to produce correct output results. Scan paths producing correct output results are referred to as good scan paths.

In step 310 a scan path clock set is generated for each of the scan paths. A scan path clock set includes all the clock element nodes ("clock elements"), that provide outputs to drive flip-flops within the scan path. The scan path clock sets for the scan paths of FIG. 2 are as follows:

| Scan Path | Scan Path Clock Set |
|---|---|
| 200 | M251, M252, M253, M254 S271, S272, S273 |
| 210 | M251, M253, M254, M255, M256, M258, M259 S272, S273, S275, S276 |
| 230 | M253, M254, M256, M257, M258, M260 S274, S275, S276 |
| 240 | M253, M257, M258 S276 |

The determination of the scan path clock sets can be made through use of automated testing tools, such as, for example, PRIMETIME. Other approaches to determining the scan path clock sets will be known to individuals skilled in the relevant arts based on the teachings herein.

In step 315 a union of scan path clock sets for bad scan paths is generated. This union is created by combining the clock elements within each of the scan path clock sets for the bad scan paths. Again referring to the scan paths of FIG. 2, the union of the clock sets for the bad scan paths 210 and 230 includes M251, M253, M254, M255, M256, M257, M258, M259, M260, S272, S273, S274, S275 and S276.

In step 320 the good clock elements are removed from this union based on the good scan paths. The assumption being that all clock elements associated with good scan paths are good clock elements, thus these clock elements can be removed from the union created in step 315, which represents the potentially bad clock elements. The clock elements within the scan path clock sets of the good scan paths 200 and 240 include M251, M252, M253, M254, M257, M258, S271, S272, S273, and S276. Removing these clock elements from the union created in Step 315 results in the following set of clock elements: M255, M256, M260, S274, and S275. This set represents the clock elements that are potentially causing the scan paths to fail.

In step 325 the remaining clock elements that are contained in all failed scan paths and have multiple inputs are analyzed. The analysis examines each of the multiple input clock elements to determine whether the element is functioning correctly. Individuals skilled in the relevant arts will be aware of methods to analyze clock elements to determine whether they are functioning properly. Multiple input elements are examined first, because they are more likely to fail than single input elements. Thus, in the example of FIG. 2, clock element M256 would be analyzed.

In step 330, a determination is made whether the source or sources of errors have been determined. If the source or sources of failure is determined, method 300 proceeds to step 360 and ends. If the source or sources of failure is not determined, method 300 proceeds to step 335.

In step 335 the remaining clock elements that are contained in all failed scan paths and that have single inputs are analyzed. The analysis examines each of the single input clock elements to determine whether the element is functioning correctly. Individuals skilled in the relevant arts will be aware of methods to analyze clock elements to determine whether they are functioning properly. Thus, in the example of FIG. 2, clock elements S274 and S275 would be analyzed.

In step 340 a determination is made whether the source or sources of errors have been determined. If the source or sources of failure is determined, method 300 proceeds to step 360 and ends. If the source or sources of failure is not determined, method 300 proceeds to step 345.

In step 345 any remaining clock elements or other possible sources of errors are determined. For example, referring to the example of FIG. 2, clock elements M255, which is associated only with scan path 210 and M260, which is associated only with scan path 230, would be analyzed. If no clock elements are determined to be bad following step 345, a determination is made that the clock elements are not the source of the failures and another problem exists. (e.g., perhaps a wrong wiring diagram has been used for testing purposes.)

In an alternative embodiment, after step 320 probabilities of failure are assigned to each of the clock elements in the union of clock elements of the bad scan paths. For example, a probability of failure of 0.5 might be assigned to clock elements with multiple inputs, while a probability of failure of 0.25 might be assigned to single input elements. These probabilities could be further refined, such that, for example, different probabilities were assigned to different types of multiple input clock elements (e.g. logic gates might get a lower probability, while multiplexers would receive a higher probability). The probabilities would be developed based on actual test experience or could be estimated.

Additionally, when the union is established failure probabilities of clock elements within multiple clock sets receive greater weighting. For example, if a clock element is in clock sets for two failing chains, its failure probability could be multiplied by two, whereas if the clock element was in clock sets for three failing chains its failure probability could be multiplied by three. The specific multiplication factors can be determined based on actual studies or statistical analysis and estimation.

Another factor that can be used in the prioritization scheme is the relative position of the clock element. If a clock element occurs prior to other clock elements, then it would receive a higher failure probability weighting.

The method then prioritizes the potential failing clock elements by their failure probability. A tester examines the potentially failing clock elements in the order of the highest failure probability. In this manner, a tester could analyze the clock elements that are more likely failing first, and thereby reduce debugging time.

Figure 4:
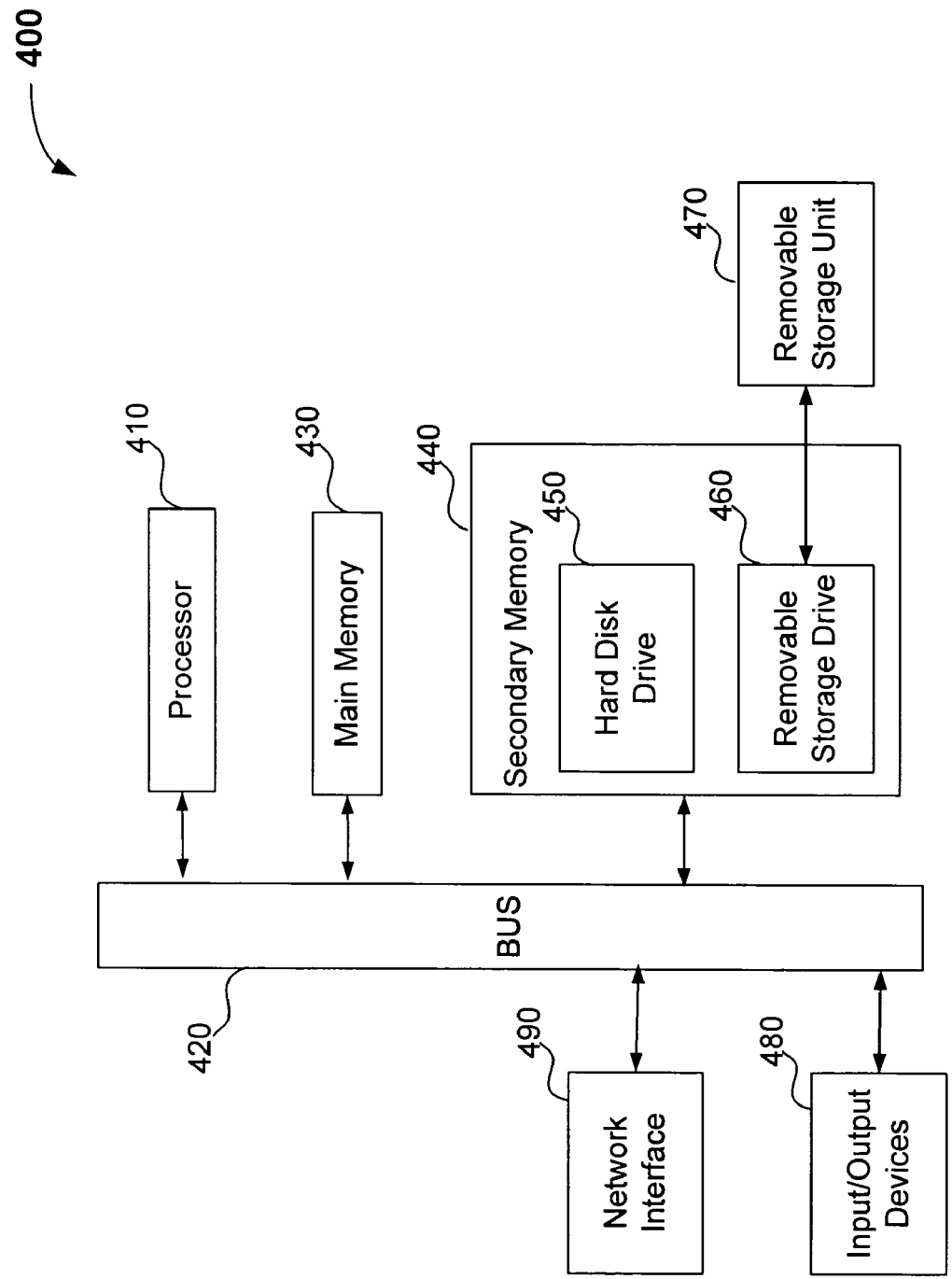
FIG. 4 is a diagram of a computer.

In an embodiment of the present invention, the methods of the present invention described herein are implemented using well known computers, such as a computer 400 shown in FIG. 4. The computer 400 can be any commercially available and well known computer capable of performing the functions described herein, such as computers available from International Business Machines, Apple, Silicon Graphics Inc., Sun, HP, Dell, Cray, etc.

Computer 400 includes one or more processors (also called central processing units, or CPUs), such as processor 410. Processor 410 is connected to communication bus 420. Computer 400 also includes a main or primary memory 430, preferably random access memory (RAM). Primary memory 430 has stored therein control logic (computer software), and data.

Computer 400 may also include one or more secondary storage devices 440. Secondary storage devices 440 include, for example, hard disk drive 450 and/or removable storage device or drive 460. Removable storage drive 460 represents a floppy disk drive, a magnetic tape drive, a compact disk drive, an optical storage device, tape backup, ZIP drive, JAZZ drive, etc.

Removable storage drive 460 interacts with removable storage unit 470. As will be appreciated, removable storage unit 460 includes a computer usable or readable storage medium having stored therein computer software (control logic) and/or data. Removable storage drive 460 reads from and/or writes to the removable storage unit 470 in a well known manner.

Removable storage unit 470, also called a program storage device or a computer program product, represents a floppy disk, magnetic tape, compact disk, optical storage disk, ZIP disk, JAZZ disk/tape, or any other computer data storage device. Program storage devices or computer program products also include any device in which computer programs can be stored, such as hard drives, ROM or memory cards, etc.

In an embodiment, the present invention is directed to computer program products or program storage devices having software that enables computer 400, or multiple computer 400s to perform any combination of the functions described herein.

Computer programs (also called computer control logic) are stored in main memory 430 and/or the secondary storage devices 440. Such computer programs, when executed, direct computer 400 to perform the functions of the present invention as discussed herein. In particular, the computer programs, when executed, enable processor 410 to perform the functions of the present invention. Accordingly, such computer programs represent controllers of the computer 400.

Computer 400 also includes input/output/display devices 480, such as monitors, keyboards, pointing devices, etc.

Computer 400 further includes a communication or network interface 490. Network interface 490 enables computer 400 to communicate with remote devices. For example, network interface 490 allows computer 400 to communicate over communication networks, such as LANs, WANs, the Internet, etc. Network interface 490 may interface with remote sites or networks via wired or wireless connections. Computer 400 receives data and/or computer programs via network interface 490. The electrical/magnetic signals having contained therein data and/or computer programs received or transmitted by the computer 400 via interface 490 also represent computer program product(s).

The invention can work with software, hardware, and operating system implementations other than those described herein. Any software, hardware, and operating system implementations suitable for performing the functions described herein can be used.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. In scan testing of an integrated circuit with a plurality of scan paths, a method for debugging scan testing failures of the integrated circuit, comprising:
   (a) identifying a plurality of bad scan paths and at least one good scan path;
   (b) generating a scan path clock set for each scan path within said plurality of bad scan paths and for at least one good scan path;
   (c) creating a union of scan path clock sets for said plurality of bad scan paths;
   (d) removing good clock elements from said union based on clock elements contained within at least one good scan path;
   (e) for each of the clock elements remaining in said union after step (d), determining a probability of failure of each clock element based on the clock element's clock input count; and
   (f) analyzing the clock elements remaining in said union after step (d) in an order based on the probabilities of failure determined in step (e).

2. The method of claim 1, wherein the scan path clock set comprises clock elements existing between a clock source and a flip-flop within a scan path for all flip-flops within the scan path.

3. The method of claim 1, wherein the probability of failure for each clock element is further based on the relative position of the clock element.

4. The method of claim 1, wherein the probability of failure for each clock element is further based on a number of bad scan paths in which the clock element is a member.

5. The method of claim 1, wherein the probability of failure for each clock element is farther based on the clock element's type.

6. A computer program product comprising a tangible computer readable storage medium having computer program code stored thereon, that when executed by a processor, causes the processor to debug clock-related scan testing failures of integrated circuits by a method comprising:
   identifying a plurality of bad scan paths and at least one good scan path;
   generating a scan path clock set for each scan path within said plurality of bad scan paths and at least one good scan path;
   creating a union of scan path clock sets for said plurality of bad scan paths;
   removing good clock elements from said union based on clock elements contained within at least one good scan path;
   determining a probability of failure for each clock element remaining in said union clock element, the probability of failure of each clock element based on the clock element's clock input count; and
   prioritizing the clock elements remaining in said union in an order based on the probabilities of failure of each clock element.

7. The computer program product of claim 6, wherein the probability of failure for each clock element is further based on the relative position of the clock element.

8. The computer program product of claim 6, wherein the probability of failure for each clock element is further based on a number of bad scan paths in which the clock element is a member.

9. The computer program product of claim 6, wherein the probability of failure for each clock element is further based on the clock element's type.

10. A method for debugging scan test failures, comprising:
    (a) identifying a plurality of failed scan paths, wherein a failed scan path is a scan path generating no output during scan testing, and each failed scan path is coupled to at least one clock element;
    (b) for each failed scan path of the plurality of failed scan paths, generating a scan path clock set including all of the clock elements coupled to the failed scan path;
    (c) generating a union set of scan path clock sets comprising a union of the scan path clock sets generated in step (b);
    (d) removing a clock element coupled to a good scan path from the union set;
    (e) after step (d), analyzing multiple-input clock elements remaining in the union set that are coupled to all failed scan paths identified in step (a);
    (f) after step (e), analyzing single-input clock elements remaining in the union set that are coupled to all failed scan paths identified in step (a); and
    (g) after step (f), analyzing clock elements in the union set not analyzed in a previous step.

11. The method of claim 10, wherein step (e) further comprises analyzing the multiple-input clock elements in an order based upon a probability of failure associated with each multiple-input clock element.

12. The method of claim 10, wherein step (f) further comprises analyzing the single-input clock elements in an order based upon a probability of failure associated with each single-input clock element.

* * * * *